United States Patent
Shimizu et al.

(10) Patent No.: US 7,691,678 B2
(45) Date of Patent: Apr. 6, 2010

(54) SOLID-STATE IMAGING DEVICE AND METHOD FOR MANUFACTURING THE SAME

(75) Inventors: Katsutoshi Shimizu, Kyoto (JP); Masanori Minamio, Takatsuki (JP); Kouichi Yamauchi, Takatsuki (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/080,557

(22) Filed: Apr. 3, 2008

(65) Prior Publication Data

US 2008/0194055 A1 Aug. 14, 2008

Related U.S. Application Data

(62) Division of application No. 10/931,101, filed on Aug. 31, 2004, now Pat. No. 7,378,748.

(30) Foreign Application Priority Data

Sep. 3, 2003 (JP) ............................. 2003-311723

(51) Int. Cl.
*H01L 21/00* (2006.01)
(52) U.S. Cl. .................. 438/114; 438/111; 438/116; 438/118; 438/462; 438/465
(58) Field of Classification Search .................. 438/111, 438/114, 116, 118, 462, 465
See application file for complete search history.

(56) References Cited

U.S. PATENT DOCUMENTS 5,523,608 A  6/1996 Kitaoka et al.
5,976,912 A * 11/1999 Fukutomi et al. ........... 438/110
6,384,472 B1  5/2002 Huang
6,509,636 B1  1/2003 Tsai et al.
6,545,332 B2  4/2003 Huang

FOREIGN PATENT DOCUMENTS

| JP | 58-127474 | 7/1983 |
| JP | 64-28853 | 1/1989 |
| JP | 4-337668 | 11/1992 |
| JP | 2001-077277 | 3/2001 |
| JP | 2004-200631 | 7/2004 |
| TW | 551611 | 9/2003 |

* cited by examiner

*Primary Examiner*—M. Wilczewski
*Assistant Examiner*—Toniae M Thomas
(74) *Attorney, Agent, or Firm*—Hamre, Schumann, Mueller & Larson, P.C.

(57) ABSTRACT

A solid-state imaging device comprises a housing in which a base and ribs forming a rectangular frame are formed in one piece by a resin; a plurality of metal lead pieces embedded in the housing, each of which has an internal terminal portion facing an internal space of the housing and an external terminal portion exposed at an outer portion of the housing; an imaging element arranged on the base in the internal space of the housing; connecting members connecting electrodes of the imaging element to the internal terminal portions of the metal lead pieces; and a transparent plate fastened to an upper face of the ribs. The upper face of the ribs is provided with a lower step portion that is lowered along an external periphery, and the transparent plate is fastened to the upper face of the ribs by an adhesive filled at least into the lower step portion. The joint between the ribs and the transparent plate has a cushioning effect with respect to stress caused by thermal deformation and the like, improving durability.

4 Claims, 8 Drawing Sheets

SOLID-STATE IMAGING DEVICE AND METHOD FOR MANUFACTURING THE SAME

This application is a division of U.S. Ser. No. 10/931,101, filed Aug. 31, 2004 which application is incorporated herein by reference.

FIELD OF THE INVENTION

The present invention relates to solid-state imaging devices, in which an imaging element such as a CCD or the like is mounted in a housing, as well as to methods for manufacturing the same.

BACKGROUND OF THE INVENTION

Figure 10:
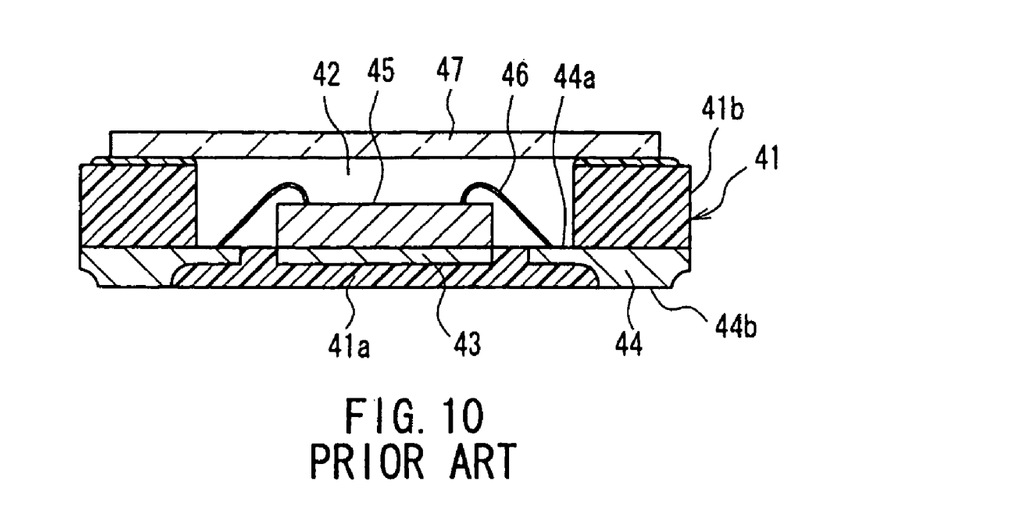
FIG. 10 is a cross-sectional view of a conventional solid-state imaging device.

Solid-state imaging devices, which are widely used for video cameras and still cameras or the like, are provided in the form of a package, in which an imaging element, such as a CCD or the like, is mounted on a base made of an insulating material, with the photo-detecting region being covered by a transparent plate. In order to make the device more compact, the imaging element is mounted on the base as a bare chip. FIG. 10 shows the solid-state imaging device disclosed in JP 2001-77277, which is a conventional example of such a solid-state imaging device.

In FIG. 10, numeral 41 denotes a housing, which is made of a base 41a and frame-shaped ribs 41b formed in one piece by resin molding. An internal space 42 is formed on the upper side of the housing 41. A die pad 43 positioned at the center of the base 41a and leads 44 positioned below the ribs 41b are embedded in the housing 41. An imaging element chip 45 disposed at the center of the internal space 42 is fastened to the upper side of the die pad 43. The leads 44 include internal terminal portions 44a that are exposed to the internal space 42 at the upper side of the base 41a on the internal side of the ribs 41b and external terminal portions 44b that are accessible from the bottom side of the base 41a below the ribs 41b. The internal terminal portions 44a and the bonding pads of the imaging element chip 45 are connected by bonding wires 46 made of metal. A transparent sealing glass plate 47 is fastened to the upper surface of the ribs 41b, thus forming a package for protection of the imaging element chip 45.

This solid-state imaging device is mounted on a circuit board with the sealing glass plate 47 facing upward, as shown in FIG. 10, and the external terminal portions 44b are used to connect it to the electrodes on the circuit board. Although not shown in the drawings, a lens barrel incorporating an imaging optical system whose relative position to the photo-detecting region formed in the imaging element chip 45 is adjusted with a predetermined precision is mounted on top of the sealing glass plate 47. During the imaging operation, object light that has passed through the imaging optical system incorporated in the lens barrel is focused on the photo-detecting region and photoelectrically converted.

A solid-state imaging device with such a configuration is connected by the external terminal portions 44b exposed at the bottom surface of the housing to electrodes on the circuit board, so that the height and the occupied surface area of the package are smaller than in configurations using a connection with outer leads bent downward from the sides of the housing, thus making it suitable for high-density packaging.

Figure 11:
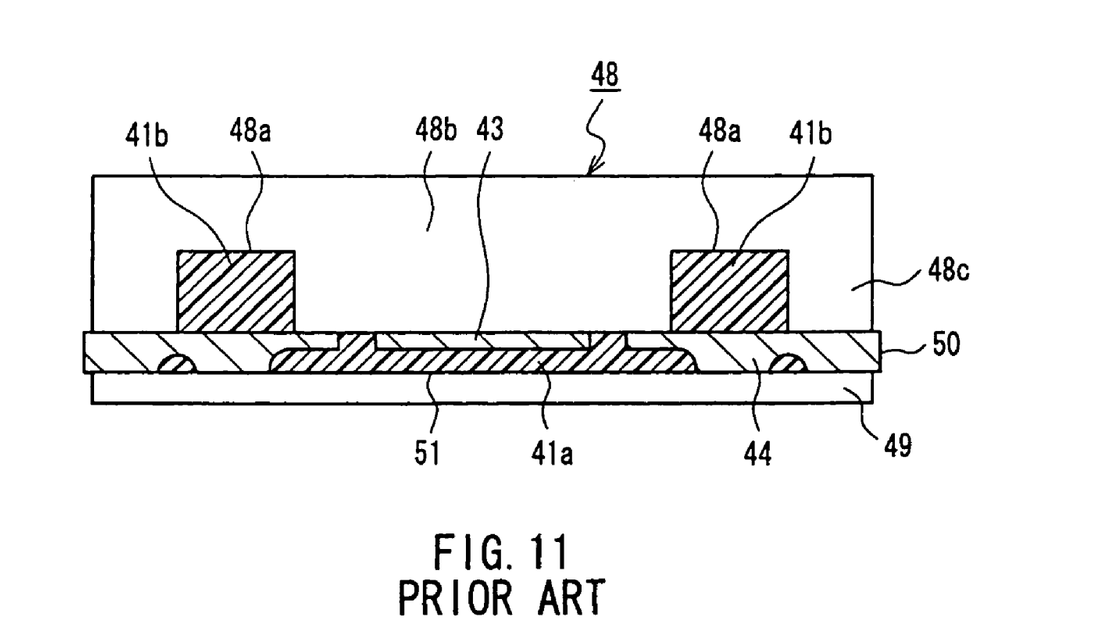
FIG. 11 is a cross-sectional view showing the step of molding the housing of this solid-state imaging device.

In the technology disclosed in JP 2001-77277, an upper mold 48 and a lower mold 49 as shown in FIG. 11 are used to resin mold the housing 41 of the shape shown in FIG. 10. The upper side of the lower mold 49 is flat. The lower side of the upper mold 48 is provided with recessed portions 48a corresponding to the ribs 41b. An internal protruding portion 48b forming the internal space 42 and external protruding portions 48c forming the external surface of the ribs 41b are provided to both sides of the recessed portions 48a. The leads 44 and the die pad 43 are supplied in integrated form as a lead frame 50, and are disposed between the upper mold 48 and the lower mold 49.

By interposing the lead frame 50 between the upper mold 48 and the lower mold 49, a cavity 51 for molding the base 41a is formed between the lower mold 49 and the internal protruding portion 48b of the upper mold 48. Under these conditions, a resin is filled in, the mold is opened and the molded product is retrieved, with the base 41a and the ribs 41b forming the housing 41 having their finished form. After the molding, the lead frame 50 is cut at locations positioned at the external side of the ribs 41b.

In the conventional solid-state imaging device described above, the sealing glass plate 47 is joined onto the upper face of the rib 41b by only a small amount of adhesive interposed between them. Because the area of the upper face of the rib 41b is small, the joining strength is weak. Furthermore, because the layer of adhesive is thin, when stress caused by thermal deformation occurs between the sealing glass plate 47 and the ribs 41b, cushioning of the distortions by the adhesive layer is small and the durability of the joint between the two is low.

SUMMARY OF THE INVENTION

It is an object of the present invention to provide a solid-state imaging device having a joint between a rib and a transparent plate placed on an upper face of the rib, which has high durability with respect to stress occurring between the members caused by thermal deformation and the like.

Furthermore, it is an object of the present invention to provide a method for manufacturing a solid-state imaging device that is suitable for mass production, by applying such a structure to a solid-state imaging device without making the manufacturing process complex.

A solid-state imaging device according to the present invention includes: a housing in which a base and ribs forming a rectangular frame are formed in one piece by a resin; a plurality of metal lead pieces embedded in the housing, each of which has an internal terminal portion facing an internal space of the housing, and an external terminal portion exposed at an outer portion of the housing; an imaging element arranged on the base in the internal space of the housing; connecting members connecting electrodes of the imaging element to the internal terminal portions of the metal lead pieces; and a transparent plate fastened to an upper face of the ribs. The upper face of the ribs is provided with a lower step portion that is lowered along an external periphery; and the transparent plate is fastened to the upper face of the ribs by an adhesive filled at least into the lower step portion.

A method for manufacturing a solid-state imaging device according to the present invention includes: resin-molding a housing including a base and rectangular frame-shaped ribs in one piece with a plurality of metal lead pieces, forming internal terminal portions and external terminal portions with the metal lead pieces; fixing an imaging element onto the base inside an internal space of the housing; connecting electrodes of the imaging element respectively to the inner terminal portions of the metal lead pieces; and fixing a transparent plate to an upper face of the ribs. A plurality of the housings are molded together with a plurality of the metal lead pieces being arranged respectively, so that rib forming members are formed with the ribs for forming adjacent housings combined into a single rib, and a groove portion is provided on the upper face of the rib forming members in the center in the width direction so as to extend in a longitudinal direction. After the imaging element is arranged inside the internal space of each housing, the electrodes of the imaging element are connected to the internal terminal portions with connecting members. Then, after an adhesive is provided on a top face of the rib forming members including the groove, a transparent plate is placed on and joined to the adhesive on the upper face of the rib forming members. Then, each housing is cut inside the groove in a direction that is perpendicular to the base and divides a width of the rib forming members into two, separating the solid-state imaging devices into individual pieces.

DESCRIPTION OF THE PREFERRED EMBODIMENTS

According to the configuration of a solid-state imaging device of the present invention, the upper face of the ribs forming the housing is provided with a lower step portion, which is lowered along the external periphery, and this lower step portion is filled with an adhesive. Thus, the adhesive for fastening the transparent plate to the upper face of the ribs has a sufficiently large volume. Consequently, when stress caused by thermal deformation acts between the ribs and the transparent plate, the adhesive of the lower step portion relieves the distortions, and the strength with respect to stress is improved.

It is preferable that a thickness of the metal lead pieces at the position of the internal terminal portion is substantially the same as a thickness of the base, and the external terminal portions are formed on a rear face corresponding to the position of the internal terminal portions. It is also preferable that an outer lateral face of the ribs forms a plane that is substantially perpendicular to a surface of the base, and an end face of the transparent plate is formed substantially flush to the outer lateral face of the ribs.

According to the method for manufacturing solid-state imaging devices of the present invention, it is easy fabricate a structure in which the lower step portion is filled with adhesive, without increasing process complexity.

It is preferable that a lead frame is used that is formed such that it includes a plurality of lead portions for forming the plurality of lead pieces, and that its thickness at a position corresponding to the internal terminal portions of the lead portions is substantially the same as a thickness of the base, and the lead frame is mounted such that a portion corresponding to the inner terminal portions of the lead portions is clamped between a lower resin molding die and a portion of an upper resin molding die forming the inner space of the housing, thus resin molding the housing.

It is also possible that a transparent plate of a size covering a plurality of housings is placed onto the upper face of the rib forming members when fastening the transparent plate, and the transparent plate is cut together when cutting the rib forming members into individual housings.

It is also possible that, when fastening the transparent plate, individual transparent plates are placed on the respective housings such that gaps are formed between edges of adjacent transparent plates above the grooves in the rib forming members, and the solid-state imagine devices are separated in the gap region.

Embodiments of the present invention are explained more specifically below with reference to the drawings.

Embodiment 1

Figure 1:
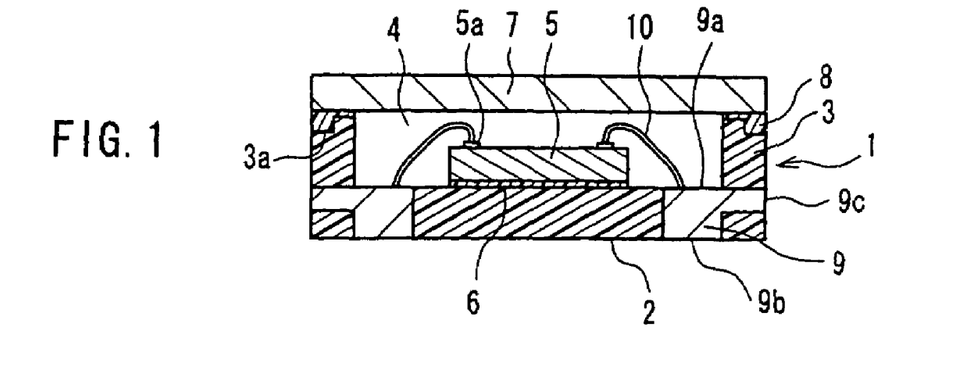
FIG. 1 is a cross-sectional view showing a configuration of a solid-state imaging device in accordance with Embodiment 1 of the present invention.
Figure 2:
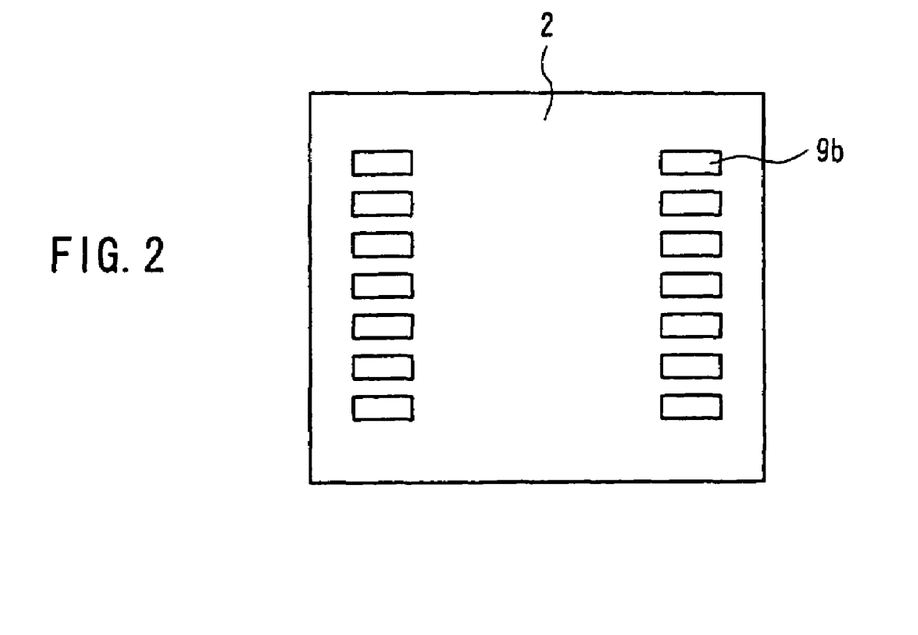
FIG. 2 is a bottom view of the solid-state imaging device of FIG. 1.
Figure 3:
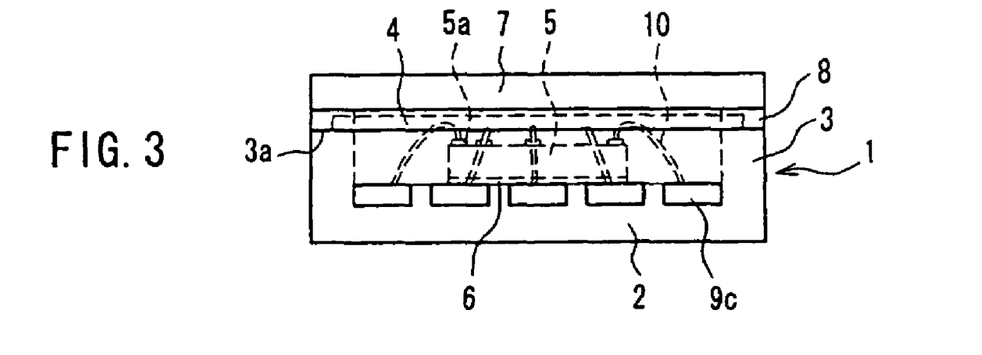
FIG. 3 is a lateral view of the solid-state imaging device of FIG. 1.

FIG. 1 shows a cross-sectional view, FIG. 2 is a bottom view, and FIG. 3 is a lateral view of the solid-state imaging device of the Embodiment 1.

Numeral 1 denotes a housing made of a plastic resin, such as epoxy resin, having rectangular frame-shaped ribs 3 arranged on a plane-shaped base 2, which is fabricated by molding in one piece. An imaging element 5 is fastened with an adhesive 6 to the base 2, facing an internal space 4 of the housing 1. A transparent plate 7 made of glass, for example, is joined with an adhesive 8 to the upper face of the ribs 3, thus sealing the internal space 4 of the housing 1 and forming a package. The height of the ribs 3 is set in a range of 0.3 to 1.0 mm, for example. A lower step portion 3a, which is lowered along the external periphery, is formed on the upper face of the ribs 3, and the adhesive 8 filled onto the lower step portion 3a forms a relatively thick layer. In practice, it is preferable that the step difference between the top end face of the ribs 3 and the lower step portion 3a is 0.05 to 0.5 mm.

Figure 4:
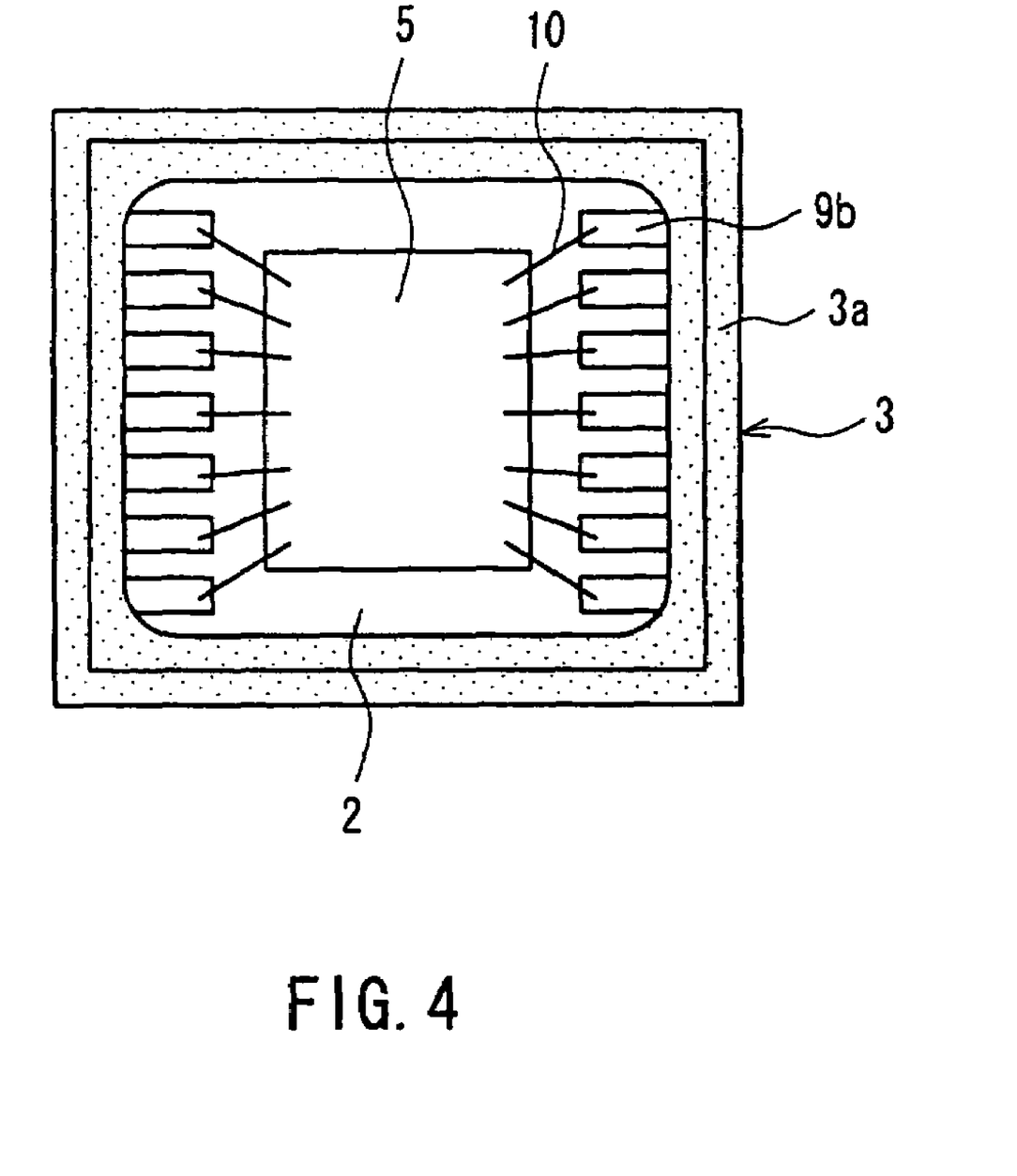
FIG. 4 is a top view of the solid-state imaging device in FIG. 1 without the transparent plate 7.

A plurality of metal lead pieces 9 are embedded in the housing 1 during molding. The metal lead pieces 9 are members for providing electrical leads from the internal space 4 of the housing 1 to the outside, and include an internal terminal portion 9a exposed at the surface of the base 2 on the side of the internal space 4, an external terminal portion 9b exposed at a position corresponding to the internal terminal portion 9a at the rear surface of the base 2, and a lateral electrode portion 9c exposed at the outer lateral surface of the base 2. The pad electrodes 5a of the imaging element 5 and the internal terminal portions 9a of the metal lead pieces 9 are connected by thin metal wires 10. The thickness of the overall package is set to not more than 2.0 mm, for example. FIG. 4 is a top view of the planar shape of the solid-state imaging device in FIG. 1 without the transparent plate 7.

In this solid-state imaging device, by forming the lower step portion 3a on the upper face of the of the ribs 3, the volume of the adhesive 8 on the lower step portion 3a can be maintained in a sufficient amount. Thus, when stress is caused by thermal deformation or the like between the transparent plate 7 and the ribs 3, the adhesive 8 on the lower step portion 3a cushions the distortion, and the strength with respect to stress is improved.

As shown in FIG. 1, the rear side corresponding to the positions of the internal terminal portions 9a of the metal lead pieces 9 forms the external terminal portions 9b. Moreover, at these portions, the metal lead pieces 9 have substantially the same thickness as the base 2. Consequently, during the resin molding, it is possible to clamp the internal terminal portions 9a and the external terminal portions 9b with the upper and lower molds. Thus, the surface of the internal terminal portions 9a is pressed down by the surface of the upper mold and is in close contact therewith, so that the generation of resin burrs can be suppressed. Those portions of the metal lead pieces 9 that are located below the ribs 3 are formed thin by half-etching, and their bottom surface is covered by resin.

As shown in FIGS. 1 and 3, the outer lateral side of the housing 1, that is, the outer peripheral surface of the ribs 3, forms a planar surface that is substantially perpendicular to the surface of the base 2. Moreover, the end surface of the transparent plate 7 and the surface of the lateral electrode portions 9c are substantially flush with the outer lateral surface of the housing 1. Such a flush shape can be formed with a favorable flatness by cutting the ribs 3 and the transparent plate 7 together during the manufacturing process.

Embodiment 2

A method for manufacturing a solid-state imaging device according to the Embodiment 2 is explained with reference to FIGS. 5A to F and FIGS. 6 and 7. This manufacturing method is for manufacturing a solid-state imaging device having the structure shown in Embodiment 1.

Figure 5A:
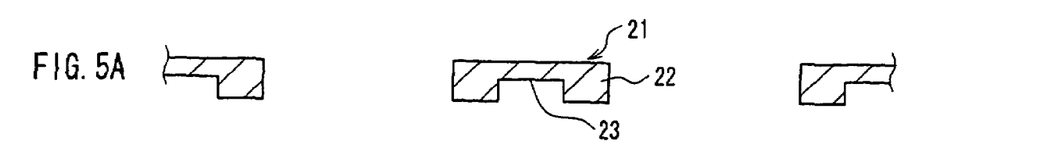
FIGS. 5A to 5F are cross-sectional views illustrating a method for manufacturing a solid-state imaging device according to Embodiment 2 of the present invention.

First, as shown in FIG. 5A, a lead frame 21 is prepared. As shown in the top view of FIG. 6, the lead frame 21 is a frame in which a plurality of lead portions 22 are linked in order to form the metal lead pieces 9 shown in FIG. 1. The thickness at the position corresponding to the internal terminal portions 9a of the lead portions 22 is set substantially identical to the thickness of the base 2. The lead portions 22 have recessed portions 23 formed in their bottom surface by half-etching, and the shape of the metal lead pieces 9 shown in FIG. 1 is attained by cutting at this portion in a later process step.

Figure 5B:
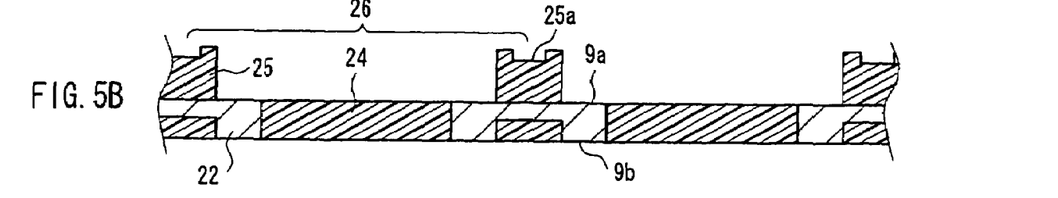
Figure 7:
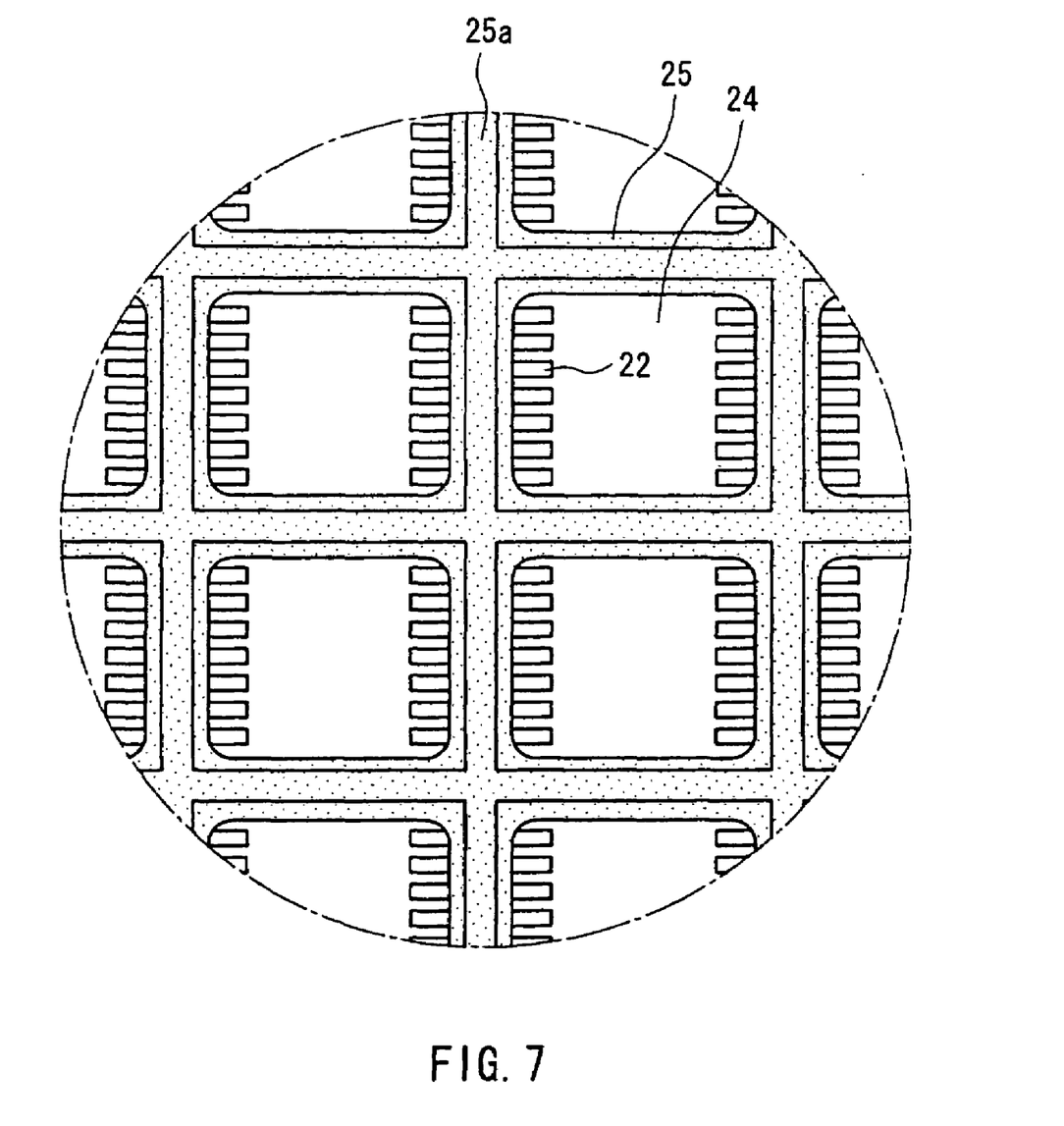
FIG. 7 is a top view of the molded resin product in which the lead frame is embedded in this manufacturing method.

Next, the lead frame 21 is embedded, as shown in FIG. 5B, so that a resin molded product including a plurality of housings 26 made of bases 24 and ribs 25 is formed in one piece. FIG. 7 shows the planar shape after the molding. The embedding is performed such that the upper and lower surfaces of the lead portions 22 are exposed at the upper and lower surface of the base 24, forming the internal terminal portions 9a and the external terminal portions 9b. The rib forming members 25 have a shape obtained by combining the ribs of adjacent housings 26 into one. A groove portion 25a is provided on the upper face of the rib forming members 25, arranged at the center in the width direction and extending in the longitudinal direction. The wall of the groove portion 25a could be inclined. Also, the bottom of the groove portion 25a could be a shape other than flat.

Figure 5C:
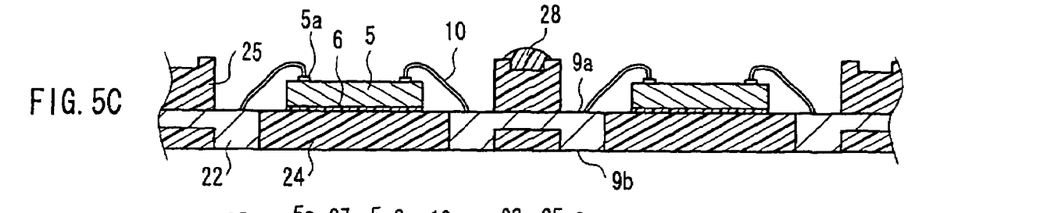

Next, as shown in FIG. 5C, the imaging element 5 is fastened by the adhesive 6 in the internal space of the housings 26 which is enclosed by the rib forming members 25, and the pad electrodes 5a of the imaging element 5 and the internal terminal portions 9a are connected by the thin metal wires 10. Furthermore, an adhesive 28 is coated on the upper face of the rib forming members 25, with the groove portion 25a at the center. The amount of adhesive that is applied is slightly more than the amount necessary to fill the groove portion 25, and is set such that an appropriate thickness of adhesive 28 is interposed between the end faces on both sides of the groove portion 25a and the transparent plate 27 when the transparent plate 27 is mounted, as explained later.

Figure 5D:
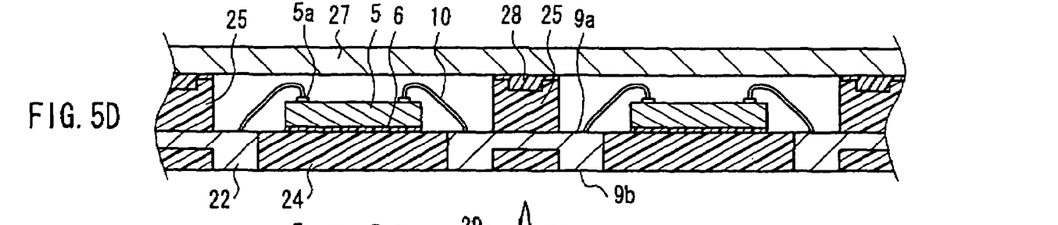

Next, as shown in FIG. 5D, the transparent plate 27 is placed on and fastened to the upper face of the rib forming members 25 to which the adhesive 28 has been applied.

Figure 5E:
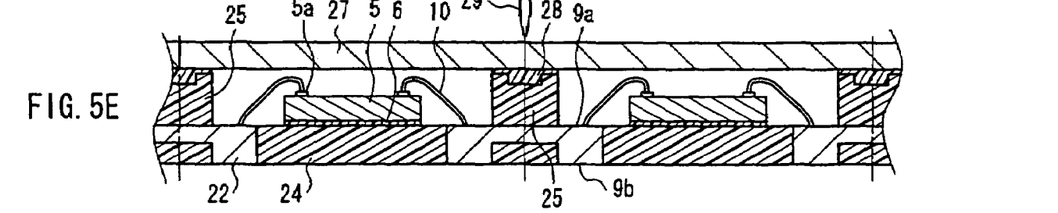
Figure 5F:
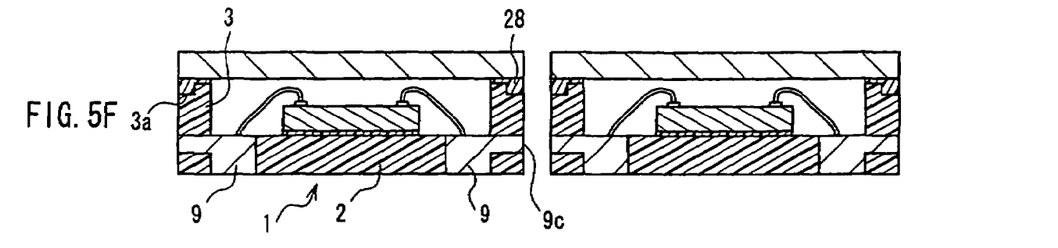
Figure 6:
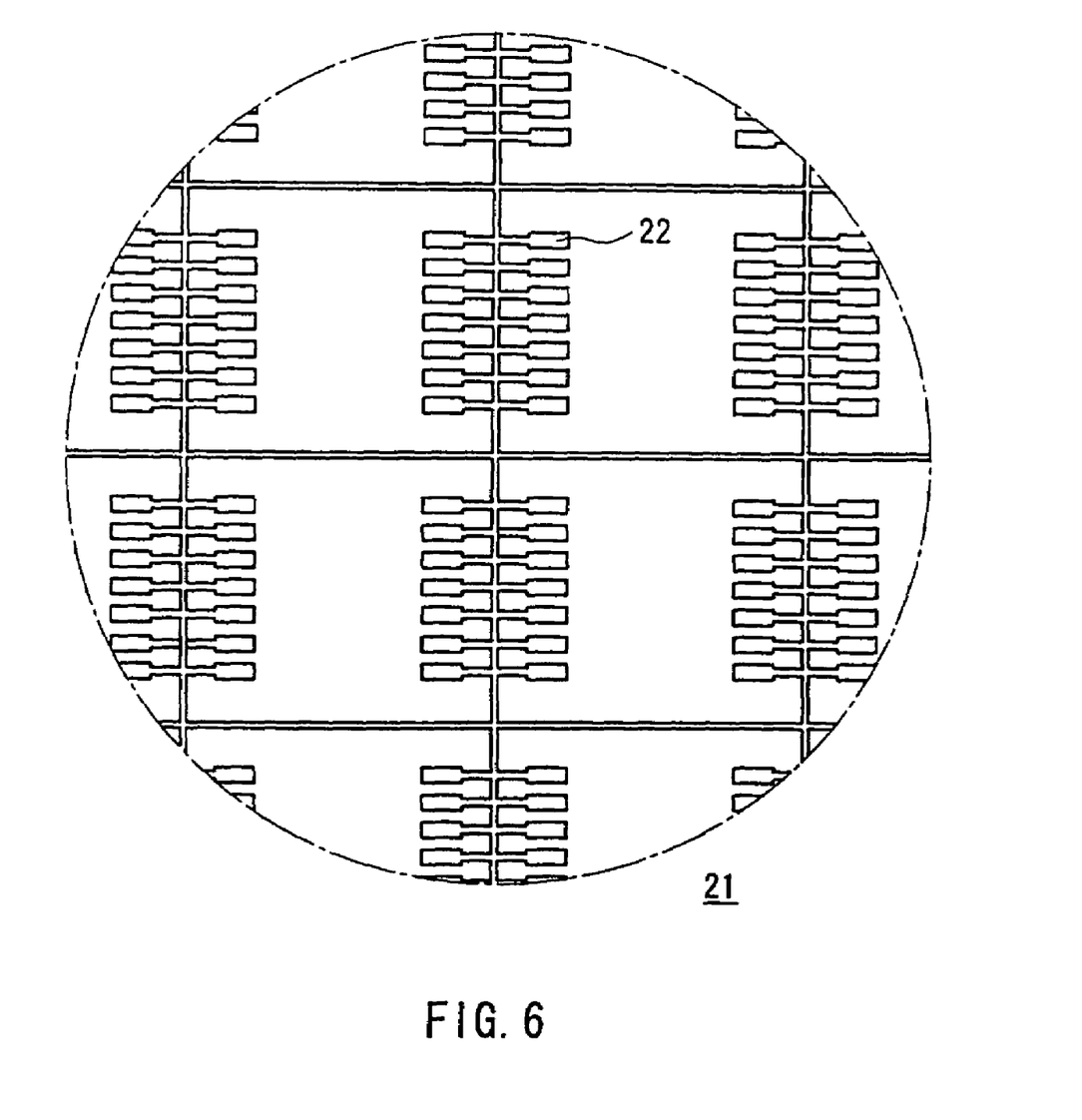
FIG. 6 is a top view of the lead frame in this manufacturing method.

Next, as shown in FIG. 5E, the transparent plate 27, the rib forming member 25, the lead portion 22 and the base 24 are cut with a dicing blade 29, and separated into individual pieces forming the solid-state imaging devices as shown in FIG. 5F. As shown in FIG. 5E, cutting is performed in the groove portion 25a in a direction perpendicular to the base 24, and in the direction dividing the width of the rib forming members 25 into two when viewed from above. As a result, the housing 1 made of the transparent plate 7, the base 2 and the rib 3 that constitute a single solid-state imaging device, and the metal lead pieces 9, are formed by the divided transparent plate 27, the rib forming members 25, the lead portions 22 and the base 24. The lower step portion 3a remains on the upper face of the ribs 3. Furthermore, the lateral electrode portion 9c of the metal lead piece 9 is exposed.

According to the manufacturing method of the present embodiment, it is easy to make a structure in which the lower step portion 3a is filled with the adhesive 28 without making the process complex. Furthermore, the volume of resin in the rib forming members 25 is reduced by forming the groove portion 25a, thereby reducing thermal contraction and expansion.

The single rib forming member 25, which is formed by combining the two ribs of adjacent housings 26, can be set to a width less than twice the width of a single rib formed individually. Consequently, if it is cut in half as shown in FIG. 5E, the width of the ribs 3 of the individual solid-state imaging devices shown in FIG. 5F is less than that of a single rib molded individually, and the area of the solid-state imaging device can be reduced by this amount.

Even in this case, the width of the rib forming members 25 can be maintained in a sufficient range to coat the adhesive for joining the transparent plate 27. In the most extreme case, if the rib forming members 25 are molded with the same width as the individually formed ribs and then cut into two pieces, then after cutting it is possible to provide a width of the ribs 3 half that of conventional ribs.

Moreover, when cutting the ribs 25 in two pieces in the width direction, the cutting plane is perpendicular to the substrate portion 24. By contrast, if the ribs are formed individually as in the conventional art, then a taper for breaking the device from the mold after molding has to be provided on the outer lateral surface of the ribs. Consequently, the width of ribs that are fabricated in accordance with the present invention is reduced by the amount saved by not providing the taper portion.

Furthermore, since the transparent plate 27, rib forming member 25 and the lead portions 22 are cut together with the same dicing blade 29, the lateral surface of the package, which is formed by the end face of the transparent cover 27, the lateral surface of the casing 1, and the end surface of the metal lead pieces 9, is substantially flush, and a favorable degree of flatness can be attained. Consequently, when mounting the device in the lens barrel accommodating the optical system, positioning of the optical system with respect to the photodetecting portion of the imaging element 5 can be performed with high precision utilizing the lateral face of the package. That is to say, the device easily can be positioned with regard to the horizontal position by abutting the lateral surface of the package against the inner surface of the lens barrel. It should be noted that the positioning in the vertical direction can be performed by abutting the lower surface of the lens barrel against the circuit board surface.

Figure 8A:
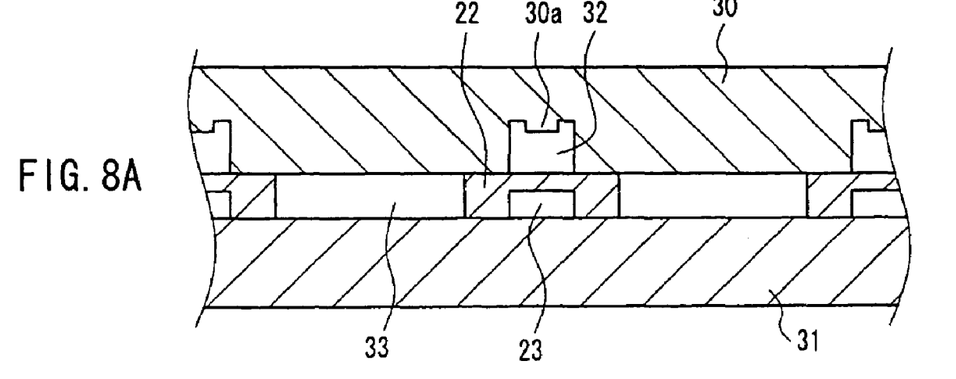
FIGS. 8A to 8C are cross-sectional views showing the resin molding step of this manufacturing method in more detail.
Figure 8B:
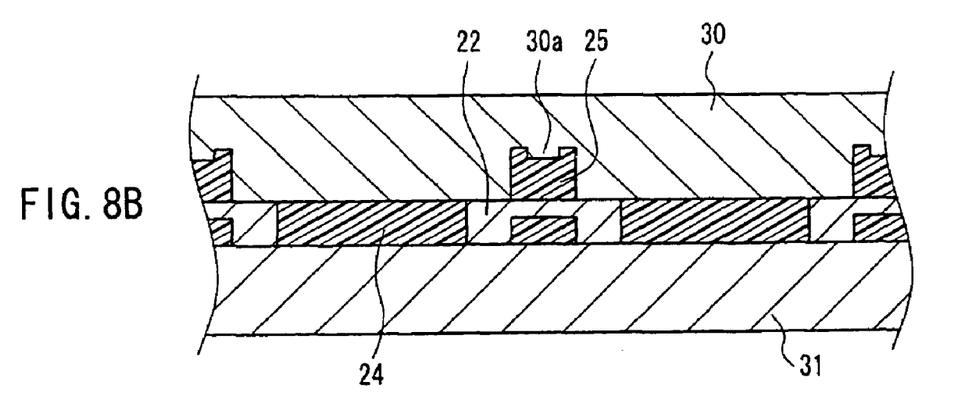
Figure 8C:
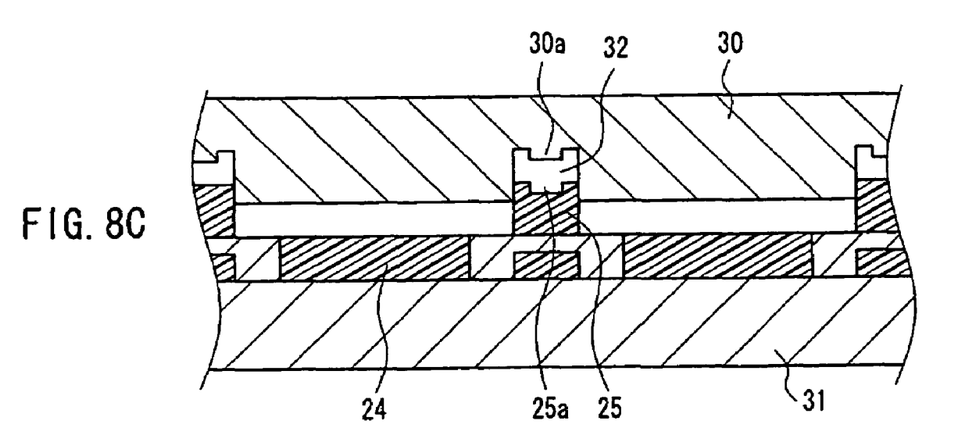

Referring to FIGS. 8A to 8C, the following is a more specific explanation of the process step for molding the housing with a resin, as shown in FIG. 5B of the above-described manufacturing process.

First, as shown in FIG. 8A, a lead frame is interposed between the upper mold 30 and the lower mold 31, and the upper and lower surfaces of the lead portions 22 are clamped by the upper mold 30 and the lower mold 31. The upper surface of the lower mold 31 is flat, but a recessed portion 32 for the purpose of forming the rib forming members 25 is provided on the lower surface of the upper mold 30. In the base surface of the recessed portion 32, a protruding portion 30a is provided for the purpose of molding the groove portion 25a. By interposing the lead portions 22, a space 33 formed between the upper mold 30 and the lower mold 31, a space of the recessed portion 32 of the upper mold 30, and a space of the recessed portion 23 of the lead portions 22 form the cavities for the resin molding.

Next, as shown in FIG. 8B, a resin is filled into the cavity, and the base 24 and the rib forming members 25 are molded. After that, the dies are opened as shown in FIG. 8C, and a molded product of linked housings as shown in FIG. 5B is retrieved.

It should be noted that it is also possible to form the groove portion 25a by arranging a mold ejector pin in the same place, and with the same size and dimensions as the protruding portion 30a, instead of forming the protruding portion 30a in the base surface of the recessed portion 32.

Furthermore, in the process described above, the upper and lower surfaces of the lead portions 22 are clamped by the upper mold 30 and the lower mold 31, ensuring that the die surfaces and the upper and lower surfaces of the lead portions 22 are consistently in close contact. Moreover, the border between the upper mold 30 and the recessed portion 32 is located above the lead portions 22. As a result, the creation of resin burrs caused by the molding can be suppressed effectively.

Furthermore, generation of burrs can be controlled even more effectively if a resin sheet for suppressing resin flash burrs during resin molding of the housing is interposed between the dies and the lead frame 21.

Embodiment 3

The method for manufacturing solid-state imaging devices according to the Embodiment 3 is explained with reference to FIG. 9. This manufacturing method is largely the same as the manufacturing method according to Embodiment 2, but differs from Embodiment 2 in that for the transparent plate, individually mounted transparent plates are used instead of a transparent plate with a large surface area spanning the region of a plurality of solid-state imaging devices. The first part of the process is the same as that shown in FIGS. 5A to 5C, so that further explanations thereof are omitted.

Figure 9A:
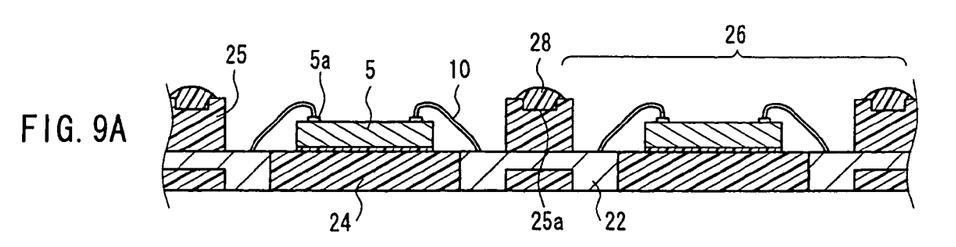
FIGS. 9A to 9C are cross-sectional views illustrating a method for manufacturing a solid-state imaging device according to Embodiment 3 of the present invention.

First, as shown in FIG. 9A, an adhesive 28 is coated onto the upper face of the rib forming members 25, with the groove portion 25a at the center, after fastening the imaging elements 5 and completing their connection with the thin metal wires 10 inside the internal space of the housings 26 enclosed by the rib forming members 25.

Figure 9B:
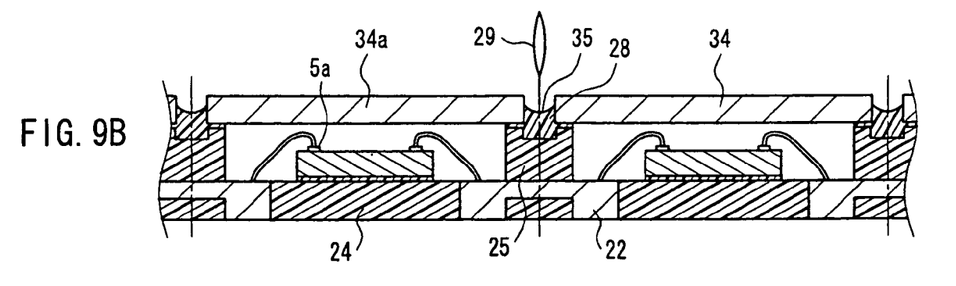

Next, the transparent plates are mounted onto respective housings as shown in FIG. 9B. The peripheral edges of adjacent transparent plates 34 are set to a size to form a predetermined gap within the groove portion 25a of the upper face of the rib forming members 25. Consequently, by mounting the transparent plates 34 on the adhesive 28, a fillet 35 is formed by the adhesive 28 entering the gap between the transparent plates 34.

Figure 9C:
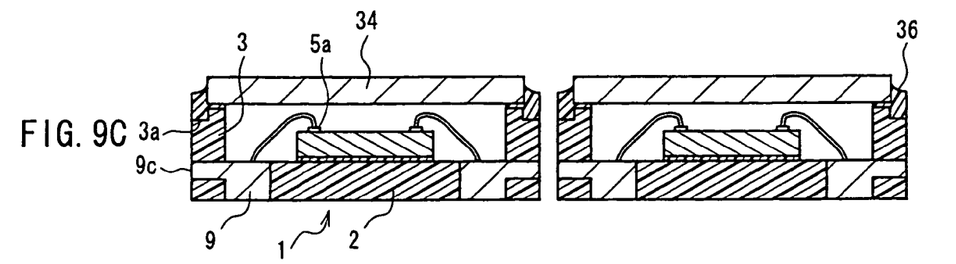

Next, as shown in FIG. 9C, the fillet 35, the rib forming members 25, the lead portion 22 and the base 24 are cut with the dicing blade 29, and separated into pieces forming the solid-state imaging devices. Similarly to Embodiment 2, cutting is performed in the groove portion 25a, in a direction perpendicular to the base 24, such that the width of the rib forming members 25 is divided into two when viewed from above. As a result, the housing 1 made of the base 2 and the ribs 3, which constitute individual solid-state imaging devices, and the metal lead pieces 9, are formed by the cut rib forming members 25, the lead portions 22 and the base 24. A fillet 36 remains at the peripheral edge of the transparent plate 34.

With this manufacturing method, fillets 36 are formed at the peripheral edge of the transparent plate 34 and the transparent plate 34 is fastened securely, even if the width of the ribs 25 is not sufficiently large.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a solid-state imaging device, comprising: resin-molding a housing including a base and rectangular frame-shaped ribs in one piece with a plurality of metal lead pieces, forming internal terminal portions and external terminal portions with the metal lead pieces; fixing an imaging element onto the base inside an internal space of the housing; connecting electrodes of the imaging element respectively to the inner terminal portions of the metal lead pieces; and fixing a transparent plate to an upper face of the ribs, wherein a plurality of the housings are molded together with a plurality of the metal lead pieces being arranged respectively, so that rib forming members are formed with the ribs for forming adjacent housings combined into a single rib, and a groove portion is provided on the upper face of the rib forming members in the center in the width direction so as to extend in a longitudinal direction, after the imaging element is arranged inside the internal space of each housing, the electrodes of the imaging element are connected to the internal terminal portions with connecting members, then, after an adhesive is provided on a top face of the rib forming members including the groove, a transparent plate is placed on and joined to the adhesive on the upper face of the rib forming members, and then, each housing is cut inside the groove in a direction which is perpendicular to the base and which divides a width of the rib forming members into two, separating the solid-state imaging devices into individual pieces.

2. The method for manufacturing a solid-state imaging device according to claim 1, wherein a lead frame is used that is formed such that it includes a plurality of lead portions for forming the plurality of lead pieces, and that its thickness at a position corresponding to the internal terminal portions of the lead portions is substantially the same as a thickness of the base, and the lead frame is mounted such that a portion corresponding to the inner terminal portions of the lead portions is clamped between a lower resin molding die and a portion of an upper resin molding die forming the inner space of the housing, thus resin molding the housing.

3. The method for manufacturing a solid-state imaging device according to claim 1, wherein a transparent plate of a size covering a plurality of housings is placed onto the upper face of the rib forming members when fastening the transparent plate, and the transparent plate is cut together when cutting the rib forming members into individual housings.

4. The method for manufacturing a solid-state imaging device according to claim 1, wherein, when fastening the transparent plate, individual transparent plates are placed on the respective housings such that gaps are formed between edges of adjacent transparent plates above the grooves in the rib forming members, and the solid-state imaging devices are separated in the gap region.

* * * * *